US012570895B2

(12) United States Patent
Miyanaga et al.

(10) Patent No.: US 12,570,895 B2
(45) **Date of Patent: \*Mar. 10, 2026**

(54) DISPLAY DEVICE

(71) Applicant: TOPPAN INC., Tokyo (JP)

(72) Inventors: Akiharu Miyanaga, Fukuoka (JP); Tetsuji Ito, Fukuoka (JP); Mayuko Watanabe, Fukuoka (JP)

(73) Assignee: Toppan Inc., Tokyo (JP)

( \* ) Notice: Subject to any disclaimer, the term of this patent is extended or adjusted under 35 U.S.C. 154(b) by 0 days.

This patent is subject to a terminal disclaimer.

(21) Appl. No.: 18/768,915

(22) Filed: Jul. 10, 2024

(65) Prior Publication Data

US 2024/0365576 A1      Oct. 31, 2024

Related U.S. Application Data

(63) Continuation of application No. 18/132,160, filed on Apr. 7, 2023, now Pat. No. 12,069,878, which is a
(Continued)

(30) Foreign Application Priority Data

Nov. 8, 2017    (JP) ................................. 2017-215801

(51) Int. Cl.
  *H10K 50/115*      (2023.01)
  *C09K 11/02*      (2006.01)
  (Continued)
(52) U.S. Cl.
  CPC ............ *C09K 11/02* (2013.01); *H10K 50/115* (2023.02); *H10K 59/1213* (2023.02);
  (Continued)

(58) Field of Classification Search
  None
  See application file for complete search history.

(56) References Cited

U.S. PATENT DOCUMENTS 11,672,135 B2 \*  6/2023  Miyanaga .......... H10K 59/1213
                                                        257/13
12,069,878 B2 \*  8/2024  Miyanaga .............. C09K 11/70
                    (Continued)

FOREIGN PATENT DOCUMENTS

CN          106549109          3/2017
JP          2009-277788        11/2009
                    (Continued)

OTHER PUBLICATIONS

Office Action from Japan Patent Office (JPO) in Japanese Patent Appl. No. 2024-063065, dated Aug. 27, 2024, together with an English language translation.
(Continued)

*Primary Examiner* — Kyoung Lee
(74) *Attorney, Agent, or Firm* — Greenblum & Bernstein, P.L.C.

(57)          ABSTRACT

Provided is a display device containing quantum dots. A display device includes a display area. The display area has a light emitting device in which a first electrode, a layer between the first electrode and an emitting layer, the emitting layer, a layer between the emitting layer and a second electrode, and the second electrode are stacked in this order on a substrate. The emitting layer is formed of an inorganic layer containing quantum dots, and the light emitting device is a top emission device. A thin film transistor connected to the light emitting device is preferably an n-ch TFT.

13 Claims, 16 Drawing Sheets

Related U.S. Application Data continuation of application No. 16/759,105, filed as application No. PCT/JP2018/041260 on Nov. 7, 2018, now Pat. No. 11,672,135.

(51) Int. Cl.

| | |
|---|---|
| *H10K 59/121* | (2023.01) |
| *H10K 77/10* | (2023.01) |
| *H10D 30/67* | (2025.01) |
| *H10D 62/80* | (2025.01) |
| *H10D 86/40* | (2025.01) |
| *H10D 86/60* | (2025.01) |
| *H10K 59/12* | (2023.01) |
| *H10K 102/00* | (2023.01) |

(52) U.S. Cl.
CPC ....... *H10K 77/111* (2023.02); *H10D 30/6755* (2025.01); *H10D 62/80* (2025.01); *H10D 86/423* (2025.01); *H10D 86/60* (2025.01); *H10K 59/12* (2023.02); *H10K 2102/3026* (2023.02); *H10K 2102/311* (2023.02)

(56) References Cited

U.S. PATENT DOCUMENTS

| | | | |
|---|---|---|---|
| 2007/0295973 | A1 | 12/2007 | Jinbo et al. |
| 2008/0180020 | A1* | 7/2008 | Cok ..................... H05B 33/28 |
| | | | 313/503 |
| 2009/0284141 | A1 | 11/2009 | Sakanoue et al. |
| 2011/0291071 | A1 | 12/2011 | Kim et al. |
| 2012/0301971 | A1 | 11/2012 | Murase et al. |
| 2015/0076469 | A1 | 3/2015 | Ikemizu et al. |
| 2015/0102291 | A1* | 4/2015 | Park ................... H10K 59/131 |
| | | | 257/40 |

| | | | |
|---|---|---|---|
| 2016/0248033 | A1* | 8/2016 | Uesaka .................. H10K 50/13 |
| 2016/0280991 | A1 | 9/2016 | Chevallier et al. |
| 2017/0018742 | A1 | 1/2017 | Wilson et al. |
| 2017/0062749 | A1 | 3/2017 | Seo et al. |
| 2020/0347296 | A1 | 11/2020 | Ogura et al. |

FOREIGN PATENT DOCUMENTS

| | | |
|---|---|---|
| JP | 2011-076770 | 4/2011 |
| JP | 2014-078382 | 5/2014 |
| JP | 2016-196631 | 11/2016 |
| JP | 2017-028301 | 2/2017 |
| JP | 2017-045650 | 3/2017 |
| JP | 2017-509132 | 3/2017 |
| JP | 2017-168420 | 9/2017 |
| WO | 2011/081037 | 7/2011 |
| WO | 2013/157494 | 10/2013 |
| WO | 2014/057971 | 4/2014 |
| WO | 2019/074083 | 4/2019 |

OTHER PUBLICATIONS

International Search Report issued in International Patent Application No. PCT/JP2018/041260, dated Feb. 12, 2019.

Extended European Search Report from European Patent Office (EPO) in European Patent Application No. 18876173.8, dated Jul. 16, 2021.

Liu Shihao et al., "Top-emitting quantum dots light-emitting devices employing microcontact printing with electricfield-independent emission", Scientific Reports, vol. 6, No. 1 (Mar. 2, 2016), available at: http://www.nature.com/articles/srep22530.pdf.

Office Action from Japan Patent Office (JPO) in Japanese Patent Appl. No. 2019-552823, dated Jan. 22, 2024, together with an English language translation.

* cited by examiner

FIG. 3

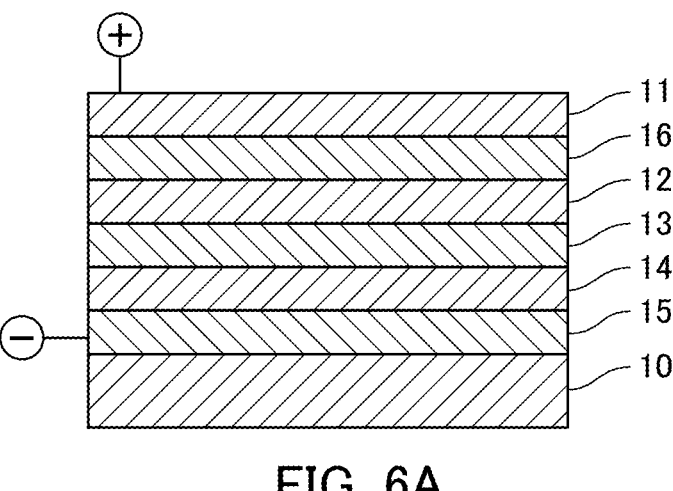
FIG. 6A
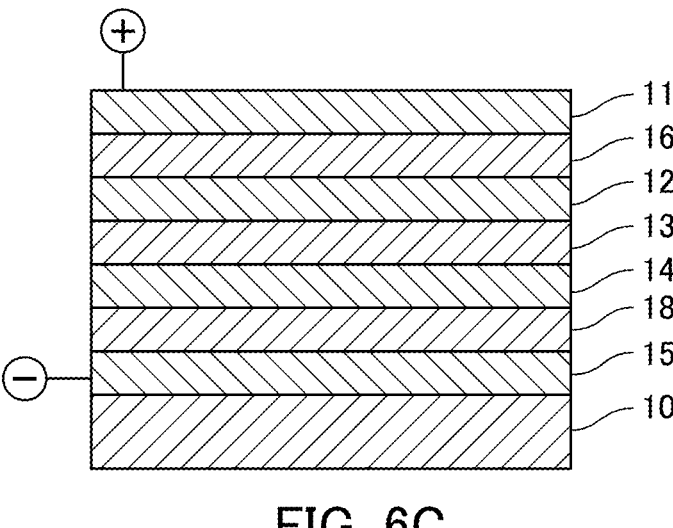
FIG. 6B
FIG. 6C

FIG. 15
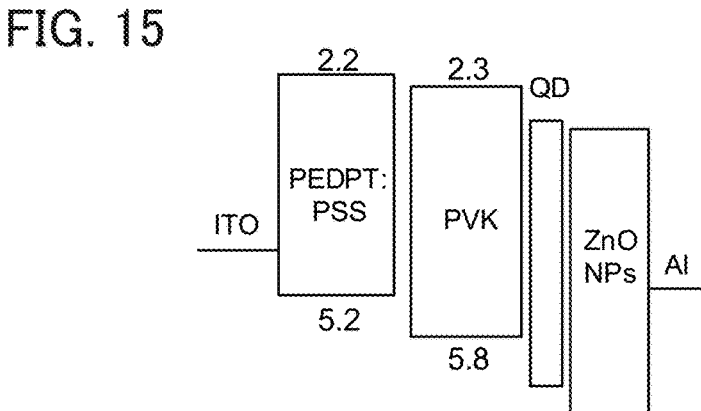
FIG. 16
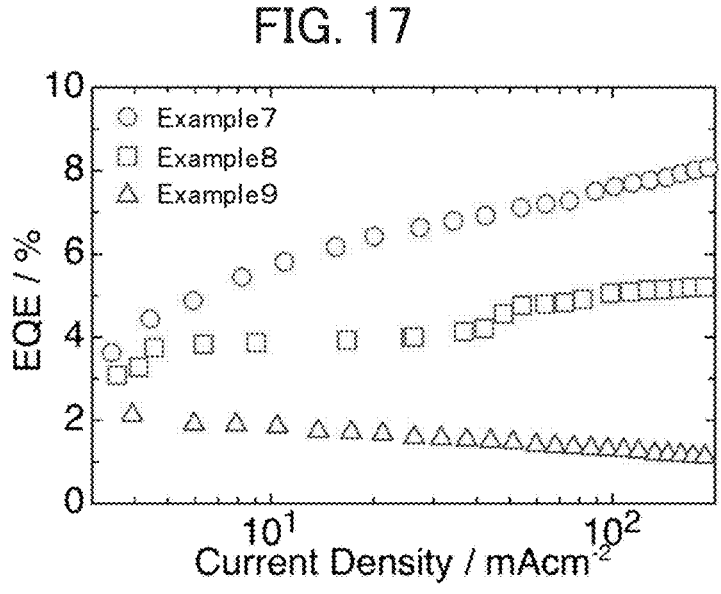
FIG. 17

| | poly-TPD | G(I3) | PEDO T:PSS | ZnSe | R(F) | PVK | G(H) | G2-5 | ZnSe 20180 802-1 | ZnO2 | L2 | L4 |
|---|---|---|---|---|---|---|---|---|---|---|---|---|
| $E_{CB}$ | 5.30 | 3.91 | 0.00 | 3.10 | 4.25 | 2.36 | 3.73 | 3.81 | 2.98 | 3.86 | 3.44 | 3.19 |
| $E_g$ | | 2.31 | | 2.75 | 1.95 | 3.54 | 2.33 | 2.33 | 2.82 | 3.47 | 3.86 | 3.91 |
| $E_{VB}$ | 5.30 | 6.22 | | 5.85 | 6.20 | 5.90 | 6.06 | 6.14 | 5.80 | 7.33 | 7.30 | 7.10 |

UV (Tauc Plot)

PL

DISPLAY DEVICE

CROSS REFERENCE TO RELATED APPLICATIONS

This is a continuation of U.S. patent application Ser. No. 18/132,160, filed Apr. 7, 2023, which is a continuation of U.S. patent application Ser. No. 16/759,105, filed Apr. 24, 2020 and now U.S. Pat. No. 11,672,135 issued Jun. 6, 2023, which is a National Stage Entry of Int. Pat. Appl. No. PCT/JP2018/041260, filed Nov. 7, 2018, which claims priority to Japanese Patent Application No. 2017-215801, filed Nov. 8, 2017. The entire disclosure of each of the above-identified documents is incorporated herein by reference in its entirety.

TECHNICAL FIELD

The present invention relates to a display device using quantum dots.

BACKGROUND ART

JP 2017-045650 A (PTL 1) discloses an invention relating to organic electro-luminescence (EL).

An organic EL device has a structure in which an anode, a hole injection layer, a hole transport layer, an emitting layer, an electron transport layer, an electron injection layer, and a cathode are stacked on a substrate. Such an organic EL device is formed from an organic compound and emits light from excitons formed by the recombination of electrons and holes injected into the organic compound.

CITATION LIST

Patent Literature

PTL 1: JP 2017-045650 A

SUMMARY OF INVENTION

Technical Problem

In recent years, light emitting devices using quantum dots are being developed. Quantum dots are nanoparticles made of around several hundreds to several thousands of atoms, each having a particle diameter of around several nanometers to several tens of nanometers. Quantum dots are also referred to as fluorescent nanoparticles, semiconductor nanoparticles, or nanocrystals. The emission wavelength of quantum dots may be variously changed depending on the particle diameter and the composition of the nanoparticles. As with an organic EL device, a light emitting device using quantum dots makes it possible to obtain a thinner device and surface emission. However, the layered structure of top emission light emitting devices using quantum dots, and the structure of display devices using such light emitting devices have not yet been established.

The present invention is made in consideration of the above, and seeks to provide a display device having a light emitting device that includes quantum dots.

Solution to Problem

A display device according to the present invention includes a display area. The display area has a light emitting device in which a first electrode, a layer between the first electrode and an emitting layer, the emitting layer, a layer between the emitting layer and a second electrode, and the second electrode are stacked in this order on a substrate. The emitting layer is formed of an inorganic layer containing quantum dots, and the light emitting device is a top emission device.

In an aspect of the present invention, a thin film transistor connected to the light emitting device is preferably an n-ch TFT.

In another aspect of the present invention, an oxide semiconductor of the thin film transistor is preferably an In—Ga—Zn—O-based semiconductor.

In yet another aspect of the present invention, the display device is preferably flexible.

In yet another aspect of the present invention, the quantum dots preferably have a structure in which a surface of a core is not covered by a shell.

In yet another aspect of the present invention, at least one of the layer between the first electrode and the emitting layer, the emitting layer, and the layer between the emitting layer and the second electrode is formed by an inkjet process.

In yet another aspect of the present invention, the layer between the first electrode and the emitting layer, and the emitting layer are preferably formed by coating; and the layer between the emitting layer and the second electrode is preferably formed by vapor deposition or coating.

Advantageous Effects of Invention

In a display device of the present invention, the layered structure of light emitting devices containing quantum dots, used in a display device can be optimized. Further, in the present invention, all the layers from the cathode to the anode can be formed of inorganic layers.

BRIEF DESCRIPTION OF DRAWINGS

In the Accompanying Drawings:

FIG. 3 is a cross-sectional view illustrating the structure of a thin film transistor different from one in FIG. 2;

FIGS. 6A to 6C are cross-sectional views each illustrating a light emitting device according to an embodiment different from that in FIG. 1;

FIG. 15 is an energy level diagram of each layer in the light emitting device used in an experiment;

FIG. 16 is a graph illustrating the relationship between the current value and the EQE of an EL emitter and a PL emitter using green quantum dots;

FIG. 17 shows plots illustrating the relationship between the current value and the EQE of an EL emitter and a PL emitter using red quantum dots; and a plot illustrating the relationship between the current value and the EQE of an EL emitter using blue quantum dots;

DESCRIPTION OF EMBODIMENTS

Embodiments of the present invention (hereinafter simply referred to as "embodiments") will now be described in detail. Note that the present invention is not limited to the following embodiments, and various modifications may be made without departing from the spirit of the present invention.

Figure 1:
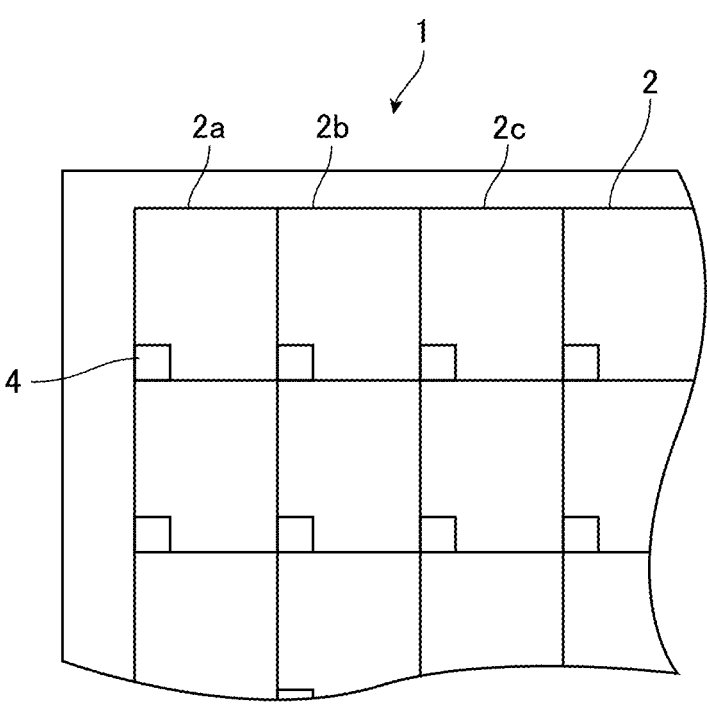
FIG. 1 is a partial plan view of a display device according to one embodiment.

As illustrated in FIG. 1, a plurality of display areas 2 are arranged in a matrix in the display device 1. The display areas 2 fall into three types: red emission regions 2a emitting red light, green emission regions 2b emitting green light, and blue emission regions 2c emitting blue light. These three emission regions 2a, 2b, and 2c are for example arranged in a row direction to form a set constituting one pixel for color display.

In each of the emission regions 2a, 2b, and 2c, a light emitting device 3 is formed. The layer structure of the light emitting device 3 will be described below. A thin film transistor (TFT) 4 is connected to each light emitting device 3. The light emitting devices 3 are top emission devices.

Figure 2:
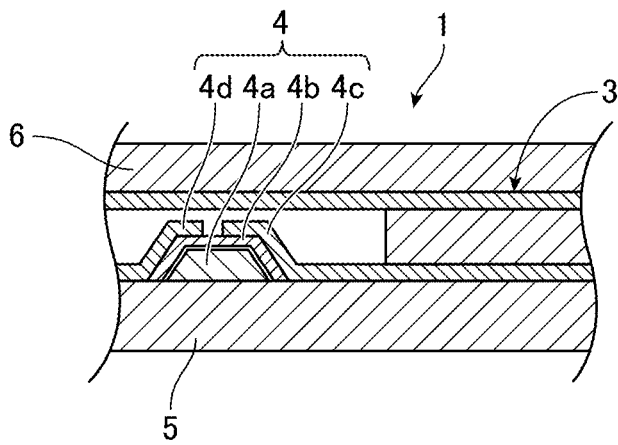
FIG. 2 is a partial enlarged cross-sectional view illustrating one of display areas of the display device depicted in FIG. 1 that is enlarged.

The thin film transistor 4 illustrated in FIG. 2 is an n-ch TFT, which is built in such a manner that a gate electrode 4a, a channel layer 4b, a gate insulating film (not shown), a drain electrode 4c, a source electrode 4d, etc. are stacked on a substrate 5. The channel layer 4b is formed from an N-type semiconductor; preferably, an oxide semiconductor is used. However, the material of the layer is not limited to this. As the oxide semiconductor, an In—Ga—Zn—O-based semiconductor is preferably used. An In—Ga—Zn—O-based semiconductor has high mobility and causes low leakage current, and thus can be suitably used in the thin film transistor. Alternatively, Poly-Si can be preferably used. The thin film transistor 4 depicted in FIG. 2 has a top-contact bottom-gate configuration; alternatively, the thin film transistor 4 may have a bottom-contact bottom-gate configuration.

The source electrode 4d is connected to a power supply line, and the drain electrode 4c is connected to the light emitting device 3.

Figure 3:
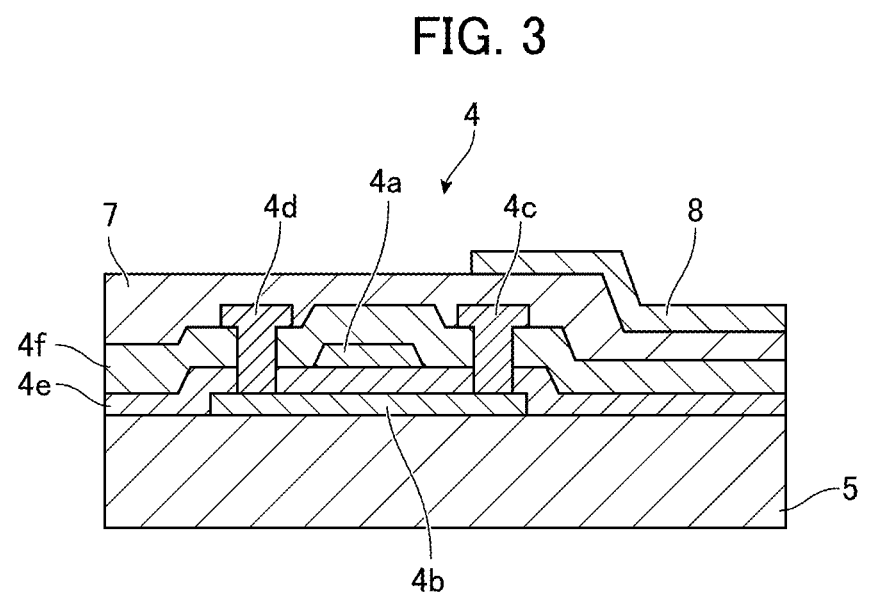

Further, the thin film transistor 4 may have a top-gate configuration depicted in FIG. 3. As illustrated in FIG. 3, the channel layer 4b is formed on the substrate 5, and the surface of the channel layer 4 is covered with the gate insulating film 4e. The gate electrode 4a is formed on the surface of the gate insulating film 4e. As illustrated in FIG. 3, the surface of the gate electrode 4a is covered with an insulating film 4f. Further, a plurality of through holes extending through the gate insulating film 4e and the insulating film 4f to reach the channel layer 4b, and the drain electrode 4c and the source electrode 4d are formed in the respective through holes. Further, the surfaces of the drain electrode 4c and the source electrode 4d are covered with a protective film 7. Further, a transparent electrode connected to the drain electrode 4c and the source electrode 4d is formed on the surface of the protective film 7. The transparent electrode 8 depicted in FIG. 3 is connected to the drain electrode 4c.

The channel layer 4b of the thin film transistor 4 shown in FIG. 3 is an N-type semiconductor, and an oxide semiconductor is preferably used. As the oxide semiconductor, an In—Ga—Zn—O-based semiconductor is preferably used.

As illustrated in FIG. 2, the display device 1 has a structure in which the thin film transistor 4 and the light emitting device 3 are interposed between a pair of substrates 5 and 6, and, although not shown, sealing resin is provided in a frame pattern between the substrates 5 and 6 so that the substrates 5 and 6 are connected with the sealing resin therebetween.

Figure 4A:
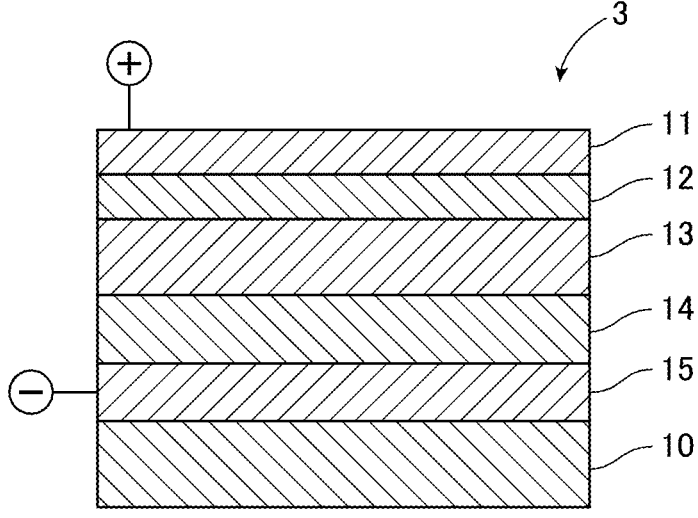
FIG. 4A is a cross-sectional view of a light emitting device of Embodiment 1.
Figure 4B:
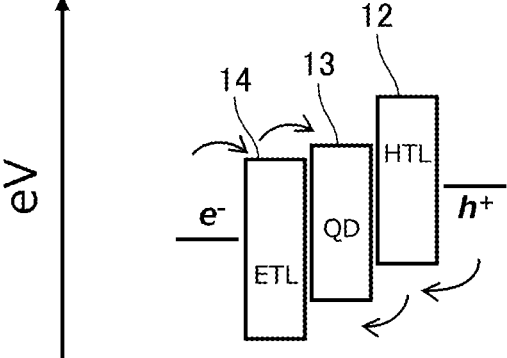
FIG. 4B is an energy level diagram of each layer in a display device of Embodiment 1.

Hereinafter, the structure of the light emitting device 3 will be described. FIG. 4A is a cross-sectional view of a light emitting device of Embodiment 1, and FIG. 4B is an energy level diagram of each layer in a display device of Embodiment 1.

As shown in FIG. 4A, the light emitting device 3 is configured to have a substrate 10, a cathode 15 formed on the substrate, an electron transport layer (ETL) 14 formed on the cathode 15, an emitting layer (EML) 13 formed on the electron transport layer 14, a hole transport layer (HTL) 12 formed on the emitting layer 13, and an anode 11 formed on the hole transport layer 12.

When a voltage is applied to between the electrodes of the light emitting device 3 in this embodiment, holes are injected from the anode 11, and electrons are injected from the cathode 15. FIG. 4B shows the energy level models of the hole transport layer 12, the emitting layer 13, and the electron transport layer 14. As shown in FIG. 4B, holes transported through the hole transport layer 12 are injected from the HOMO level of the hole transport layer 12 into the HOMO level of the emitting layer 13. On the other hand, electrons transported through the electron transport layer 14 are injected from the LUMO level of the electron transport layer 14 into the LUMO level of the emitting layer 13. The holes and electrons are recombined in the emitting layer 13, which promotes quantum dots in the emitting layer 13 to the excited state, thus light emission from the excited quantum dots can be achieved.

In this embodiment, the emitting layer 13 is formed of an inorganic layer containing quantum dots.
(Quantum Dot)

For example, quantum dots in this embodiment are nanoparticles having a particle diameter of around several nanometers to several tens of nanometers; however, the structure and the material of the quantum dots are not limited to those.

For example, quantum dots are formed from CdS, CdSe, ZnS, ZnSe, ZnSeS, ZnTe, ZnTeS, InP, (Zn)AgInS$_2$, (Zn)CuInS$_2$, etc. Because of the toxicity of Cd, the use of Cd is restricted in many countries; thus, quantum dots are preferably free of Cd.

Figure 5A:
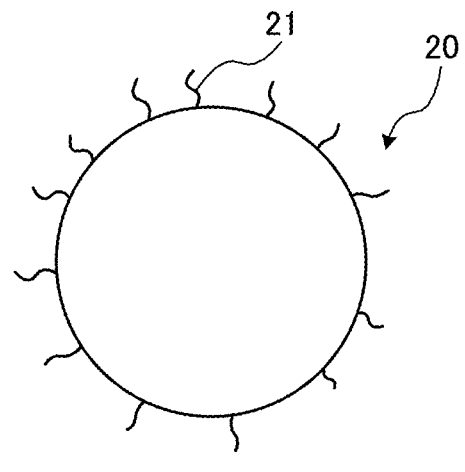
FIGS. 5A and 5B are schematic views of a quantum dot according to one embodiment.

As shown in FIG. 5A, many organic ligands 21 are preferably placed on the surface of a quantum dot 20. This can inhibit aggregation of quantum dots 20, resulting in the target optical properties. The ligands available for the reaction are not particularly limited; for example, the following ligands can be given as typical examples.

Figure 5B:
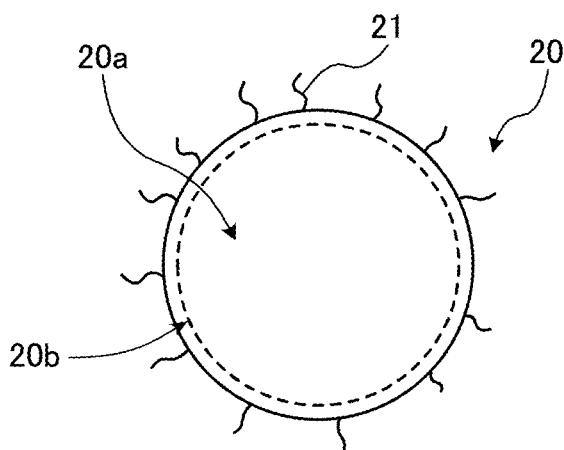

Aliphatic primary amines: oleylamine: $C_{18}H_{35}NH_2$, stearyl(octadecyl)amine: $C_{18}H_{37}NH_2$, dodecyl(lauryl)amine: $C_{12}H_{25}NH_2$, decylamine: $C_{10}H_{21}NH_2$, octylamine: $C_8H_{17}NH_2$ Aliphatic acids: oleic acid: $C_{17}H_{33}COOH$, stearic acid: $C_{17}H_{35}COOH$, palmitic acid: $C_{15}H_{31}COOH$, myristic acid: $C_{13}H_{27}COOH$, lauric (dodecanoic) acid: $C_{11}H_{23}COOH$, decanoic acid: $C_9H_{19}COOH$, octanoic acid: $C_7H_{15}COOH$ Thiols: octadecanethiol: $C_{18}H_{37}SH$, hexadecanethiol: $C_{16}H_{33}SH$, tetradecanethiol: $C_{14}H_{29}SH$, dodecanethiol: $C_{12}H_{25}SH$, decanethiol: $C_{10}H_{21}SH$, octanethiol: $C_8H_{17}SH$ Phosphines: trioctylphosphine: $(C_8H_{17})_3P$, triphenylphosphine: $(C_6H_5)_3P$, tributylphosphine: $(C_4H_9)_3P$ Phosphine oxides: trioctylphosphine oxide: $(C_8H_{17})_3P{=}O$, triphenylphosphine oxide: $(C_6H_5)_3P{-}O$, tributylphosphine oxide: $(C_4H_9)_3P{=}O$ A quantum dot 20 depicted in FIG. 5B has a core-shell structure having a core 20a and a shell 20b covering the surface of the core 20a. As shown in FIG. 5B, many organic ligands 21 are preferably placed on the surface of the quantum dot 20. The core 20a of the quantum dot 20 shown in FIG. 5B is the nanoparticle shown in FIG. 5A. Accordingly, the core 20a is formed for example from the materials listed above. The shell 20b is formed from, for example, zinc sulfide (ZnS); however, the material of the shell 20b is not limited to this. As with the core 20a, the shell 20b is preferably free of cadmium (Cd).

The shell 20b may be in a condition of being a solid solution on the surface of the core 20a. In FIG. 5B, the boundary between the core 20a and the shell 20b is indicated by a dotted line, and this means that the boundary between the core 20a and the shell 20b may or may not be identified by an analysis.

(Emitting Layer 13)

The emitting layer 13 may be formed from the above-mentioned quantum dots alone; alternatively, the emitting layer 13 may contain the quantum dots and another luminescent material other than the quantum dots. Further, the emitting layer 13 may be formed by applying quantum dots dissolved in a solvent, for example, by the inkjet process. Here, a slight amount of the solvent component may be left in the emitting layer 13.

Red quantum dots emitting red light are contained in the emitting layer 13 of the light emitting devices 3 formed in the red emission regions 2a depicted in FIG. 1. Further, green quantum dots emitting green light are contained in the emitting layer 13 in the light emitting devices 3 formed in the green emission regions 2b depicted in FIG. 1. Further, blue quantum dots emitting blue light are contained in the emitting layer 13 in the light emitting devices 3 formed in the blue emission regions 2c depicted in FIG. 1.

Note that the wavelength of blue emission is preferably around 450 nm. Thus, health risks can be reduced by adjustments such that light of a wavelength shorter than 450 nm is not emitted can.

The emitting layer 13 can be formed by an existing thin film formation method such as the inkjet process and vacuum deposition mentioned above.

(Hole Transport Layer 12)

The hole transport layer 12 is made from an inorganic material or an organic material having hole transporting functions. The hole transport layer 12 is preferably made from an inorganic material, for example, is preferably formed from an inorganic oxide such as NiO or WO$_3$. In particular, the hole transport layer 12 is preferably formed from nanoparticles of NiO. Further, for use in the hole transport layer 12, for example, Al$_2$O$_3$ or the like may be mixed in NiO. And, a metal oxide may be doped with Li, Mg, Al, etc. Further, the hole transport layer 12 may be of an inorganic material other than inorganic oxides.

As with the emitting layer 13, the hole transport layer 12 can be formed by a printing process such as the inkjet process, or may be formed by an existing thin film technique such as vacuum deposition.

(Electron Transport Layer 14)

The electron transport layer 14 is made from an inorganic material or an organic material having electron transporting functions. The electron transport layer 14 is preferably made from an inorganic material, for example, is preferably formed from an inorganic oxide such as ZnO$_x$, Ti—O, Sn—O, V—Ox, or Mo—O. Two or more of these materials may be selected as materials.

In particular, the electron transport layer 14 is preferably formed from nanoparticles of ZnO$_x$. And, a metal oxide may be doped with Li, Mg, Al, Mn, etc. Further, the electron transport layer 14 may be of an inorganic material (for example, CsPbBr$_3$ etc.) other than inorganic oxides. X is, but not limited to, around 0.8 to 1.2.

As with the emitting layer 13, the electron transport layer 14 can be formed by applying a solvent containing nanoparticles by a printing process such as the inkjet process, or may be formed by an existing thin film technique such as vacuum deposition.

(Anode 11)

In this embodiment, the material for forming the anode 11 is preferably for example, but not limited to, a metal such as Au or Ag, a conductive transparent material such as CuI-SnO$_2$ or ZnO$_x$, or a compound oxide of indium-tin (ITO). Of those, the anode 11 is preferably formed from ITO. The anode 11 can be formed as a thin film of the electrode material on the substrate 10 by a method such as vapor deposition or sputtering.

In this embodiment, since a structure in which light is given off from the anode 11 side is used, the anode 11 needs to be transparent, and is preferably a thin metal film of Ag etc. that is excellent in transparency, or one of the metal oxides excellent in transparency that are mentioned above.

(Cathode 15)

In this embodiment, for example, a compound oxide of indium-tin (ITO), a metal, an alloy, an electrically conductive compound, or a mixture of those can be used as an electrode material of the cathode 15; however, the material of the cathode 15 is not limited to those. For example, the cathode 15 is formed from ITO. The cathode 15 is, for example, formed on an opaque metal layer formed on the substrate 10. Thus, the light emitting device 3 is obtained as a top emission device.

The cathode 15 can be formed as a thin film of the electrode material by a method such as vapor deposition or sputtering.

(Substrate 10)

In this embodiment, the substrate 10 can be formed of, for example, glass or plastic; however, the material of the substrate 10 is not limited to these. Specifically, the substrate 10 is formed of, for example, glass, quartz, or a transparent resin film.

The substrate 10 may either be a rigid substrate or a flexible substrate; when a flexible substrate is used, a flexible device can be obtained. Examples of the material of the transparent film include, for example, polyethylene terephthalate (PET), polyethylene naphthalate (PEN), polyester, polyethylene, polypropylene, cellophane, cellulose diacetate, and cellulose triacetate (TAC).

In the display device 1 in FIG. 2, using flexible substrates for the substrates 5 and 6, the display device 1 can be flexible. Note that the substrates 5 and 6 can also be formed using a similar material to that of the substrate 10. The substrate 5 can also serve as the substrate 10.

In this embodiment, all the layers from the cathode 15 to the anode 11, that is, all the cathode 15, the electron transport layer 14, the emitting layer 13, the hole transport layer 12, and the anode 11 can each be formed of an inorganic layer. Forming all the layers from inorganic layers allow all the layers to be formed using the same coating/drying apparatuses, etc. and facilitates the production process. Further, the high-low relationships of the HOMO levels of the anode 11, the hole transport layer 12, and the emitting layer 13 can be optimized; the high-low relationships of the LUMO levels of the cathode 15, the electron transport layer 14, and the emitting layer 13 can be optimized. This improves the carrier balance as compared with the case of using organic compounds.

In Embodiment 1 illustrated in FIG. 4, a hole injection layer and an electron injection layer are not formed separately from the transport layers, thus the number of the layers can be reduced. Namely, the transport layers also serve as injection layers. Note however that in this embodiment, a hole injection layer and an electron injection layer made of an inorganic material may be interposed between the electrodes and the transport layers.

FIG. 6A is a cross-sectional view of a light emitting device of Embodiment 2. In FIG. 6A, the cathode 15, the electron transport layer 14, the emitting layer 13, the hole transport layer 12, a hole injection layer (HIL) 16, and the anode 11 are stacked in this order on the substrate 10. Unlike in FIG. 4A, in FIG. 6A, the hole injection layer 16 is placed between the anode 11 and the hole transport layer 12.

FIG. 6B is a cross-sectional view of a light emitting device of Embodiment 3. In FIG. 6B, the cathode 15, an electron injection layer (EIL) 18, the electron transport layer 14, the emitting layer 13, the hole transport layer 12, and the anode 11 are stacked in this order on the substrate 10. Unlike in FIG. 4A, in FIG. 6B, the electron injection layer 18 is placed between the electron transport layer 14 and the cathode 15.

FIG. 6C is a cross-sectional view of a light emitting device of Embodiment 4. In FIG. 6C, the cathode 15, the electron injection layer 18, the electron transport layer 14, the emitting layer 13, the hole transport layer 12, the hole injection layer 16, and the anode 11 are stacked in this order on the substrate 10. Unlike in FIG. 4A, in FIG. 6C, the hole injection layer 16 is placed between the anode 11 and the hole transport layer 12, and in addition, the electron injection layer 18 is placed between the electron transport layer 14 and the cathode 15.

The material of the hole injection layer 16 and the electron injection layer 18 may be either an inorganic material or an organic material. Forming the hole injection layer 16 and the electron injection layer 18 from inorganic layers is preferred because all the layers from the anode 11 to the cathode 15 can each be formed of an inorganic layer. However, the material of the injection layers is not limited to this. The material of the hole injection layer 16 and the electron injection layer 18 is selected from various kinds of materials depending on the energy level models.

In this embodiment, the layer between the cathode 15 and the light emitting layer 13 is preferably a layer serving as the electron transport layer 14, the electron injection layer 18, or both the electron injection layer and the electron transport layer; or a layer in which the electron transport layer 14 and the electron injection layer 18 are stacked.

In this embodiment, the layer between the anode 11 and the emitting layer 13 is preferably a layer serving as the hole transport layer 12, the hole injection layer 16, or both the hole injection layer and the hole transport layer; or a layer in which the hole transport layer 12 and the hole injection layer 16 are stacked.

Note that in the structure of the display device 1 depicted in FIG. 2, the thin film transistor 4 has, for example, a bottom-gate configuration, and the drain electrode 4c is connected to the cathode 15 of the light emitting device 3. Here, the drain electrode 4c can be made to serve as the cathode 15 without forming the cathode 15 superposed on the drain electrode 4c. This allows the light emitting device 3 to be suitably connected with the thin film transistor 4 and the ground line.

In this embodiment, the hole transport layer 12, the emitting layer 13, and the electron transport layer 14 can all be inorganic layers formed from nanoparticles. In such a case, each layer can be formed by printing by the inkjet process or the like, thus the layers can be formed easily and formed to be uniform in thickness. This can effectively improve emission efficiency.

Figure 7A:
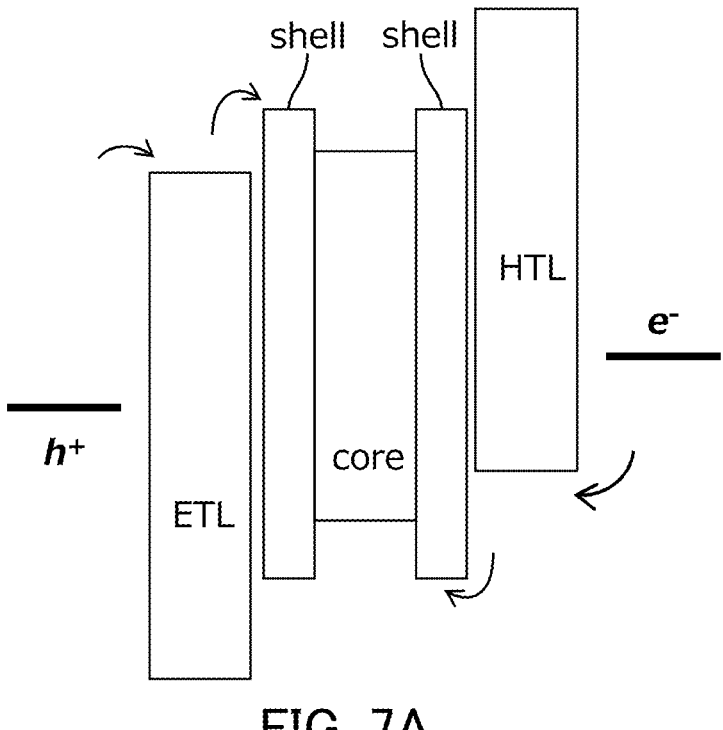
FIG. 7A is an energy level diagram in the case of using quantum dots having a core-shell structure.
Figure 7B:
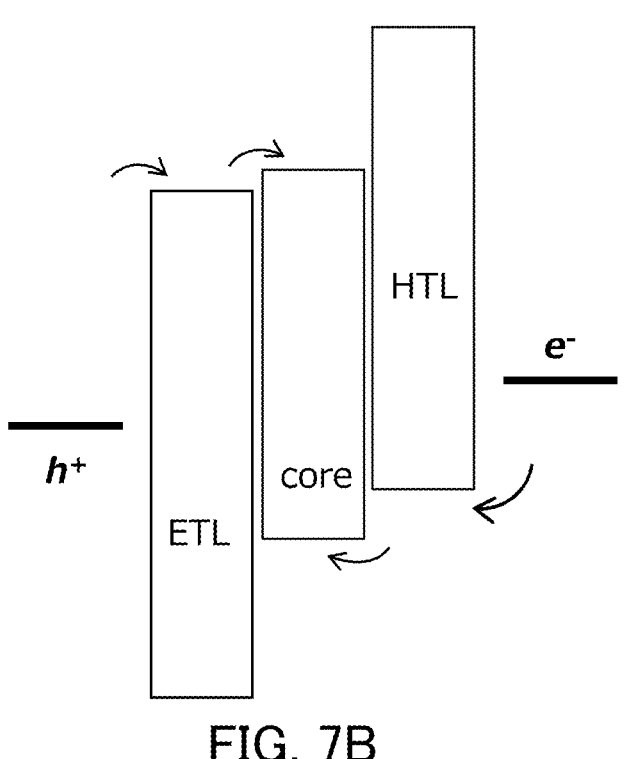
FIG. 7B is an energy level diagram in the case of using quantum dots having a structure in which a core is not covered by a shell.

When the quantum dots used in the emitting layer 13 of this embodiment have a core-shell structure, the energy level diagram presented in FIG. 7A is obtained, and the energy level of the shell would be as a barrier to the recombination of holes and electrons. Accordingly, a quantum dot of which surface is not covered with a shell (the surface of the core is exposed, or the material forming the quantum dot is uniform from the center of the quantum dot to the surface thereof) as shown in FIG. 7B is preferably used. Using such quantum dots eliminates the energy barrier to the recombination of hole and electrons, and allows holes and electrons to be efficiently recombined, thus the light emission efficiency can be improved. With a view to improving the electron transportation efficiency and the hole transportation efficiency, the organic ligands 21 are preferably placed on the surface of each quantum dot 20 as illustrated in FIG. 5A.

Figure 8A:
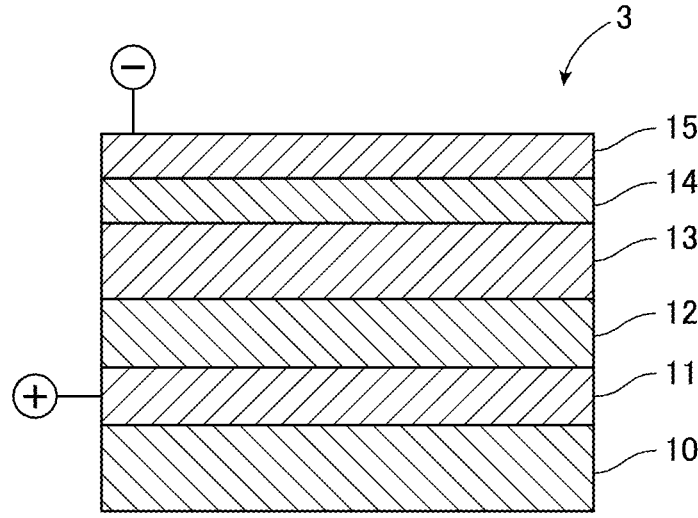
FIG. 8A is a cross-sectional view of a light emitting device different from one in FIG. 4.
Figure 8B:
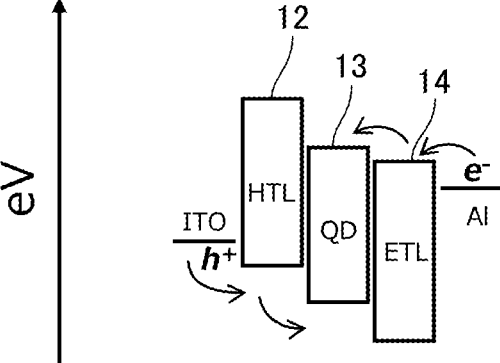
FIG. 8B is an energy level diagram of each layer in the light emitting device of FIG. 8A.

Further, in this embodiment, as illustrated in FIG. 8A, the light emitting device 3 may be configured to have the substrate 10, the anode 11 formed on the substrate, the hole transport layer (HTL) 12 formed on the anode 11, the emitting layer (EML) 13 formed on the hole transport layer 12, the electron transport layer (ETL) 14 formed on the emitting layer 13, and the cathode 15 formed on the electron transport layer 14.

The materials of the layers are as described above. Note that in FIG. 8A, the anode 11 forms a first electrode, and the cathode 15 forms a second electrode. Since the light emitting device 3 of this embodiment is a top emission device, the cathode 15 is preferably formed of a very thin transparent material such as Ag, and the anode 11 is preferably made of ITO, for example, on an opaque metal layer. This allows light to be reflected at the anode 11 and light to be given off from the surface side on the cathode 15 side (opposite to the thin film transistor side).

Figure 9A:
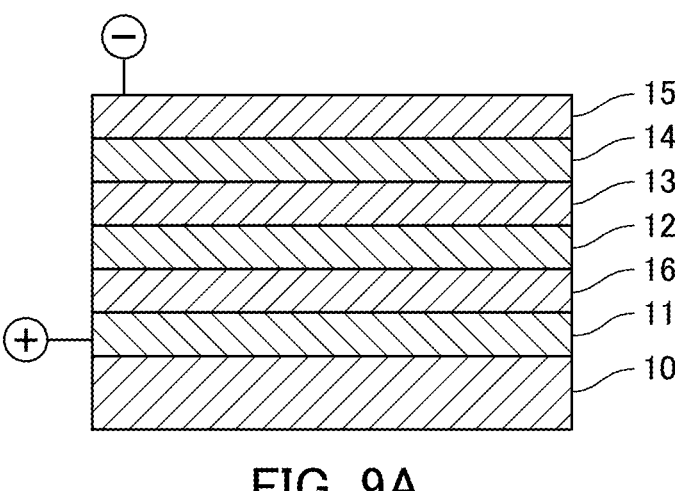
FIGS. 9A to 9C are cross-sectional views each illustrating a light emitting device according to an embodiment different from that in FIG. 8.

FIG. 9A is a cross-sectional view of a light emitting device according to a different embodiment from FIG. 8A. In FIG. 9A, the anode 11, the hole injection layer (HIL) 16, the hole transport layer 12, the emitting layer 13, the electron transport layer 14, and the cathode 15 are stacked in this order on the substrate 10. Unlike in FIG. 8A, in FIG. 9A, the hole injection layer 16 is placed between the anode 11 and the hole transport layer 12.

Figure 9B:
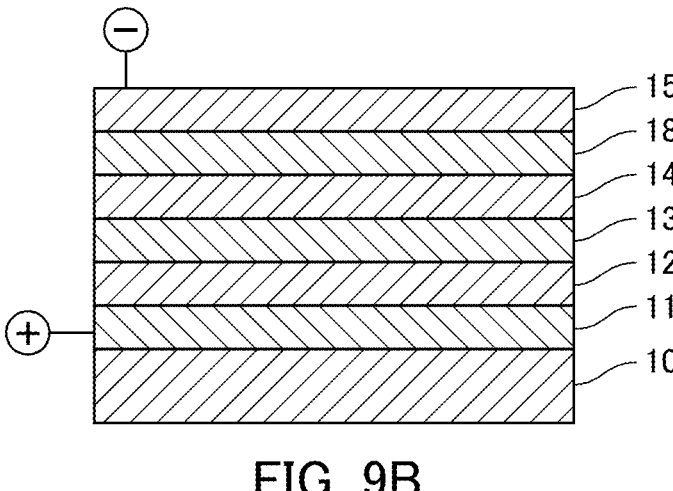

FIG. 9B is a cross-sectional view of a light emitting device according to a different embodiment from FIG. 8A. In FIG. 9B, the anode 11, the hole transport layer 12, the emitting layer 13, the electron transport layer 14, the electron injection layer (EIL) 18, and the cathode 15 are stacked in this order on the substrate 10. Unlike in FIG. 8A, in FIG. 9B, the electron injection layer 18 is placed between the electron transport layer 14 and the cathode 15.

Figure 9C:
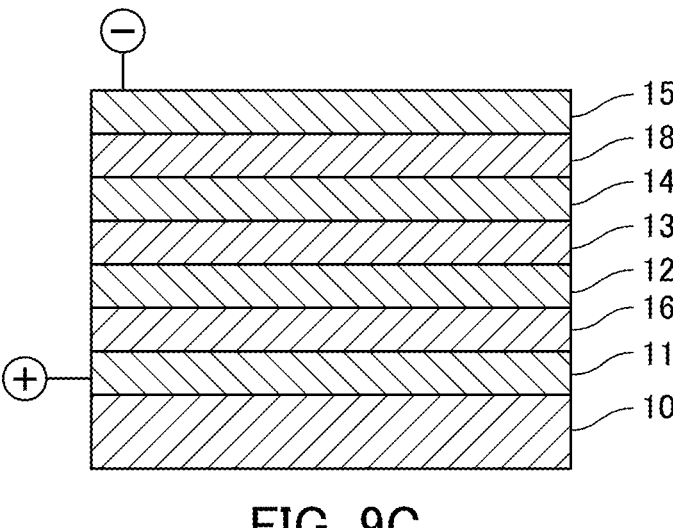

FIG. 9C is a cross-sectional view of a light emitting device according to Embodiment 4. In FIG. 9C, the anode 11, the hole injection layer 16, the hole transport layer 12, the emitting layer 13, the electron transport layer 14, the electron injection layer 18, and the cathode 15 are stacked in this order on the substrate 10. Unlike in FIG. 8A, in FIG. 9C, the hole injection layer 16 is placed between the anode 11 and the hole transport layer 12, and in addition, the electron injection layer 18 is placed between the electron transport layer 14 and the cathode 15.

Figure 10A:
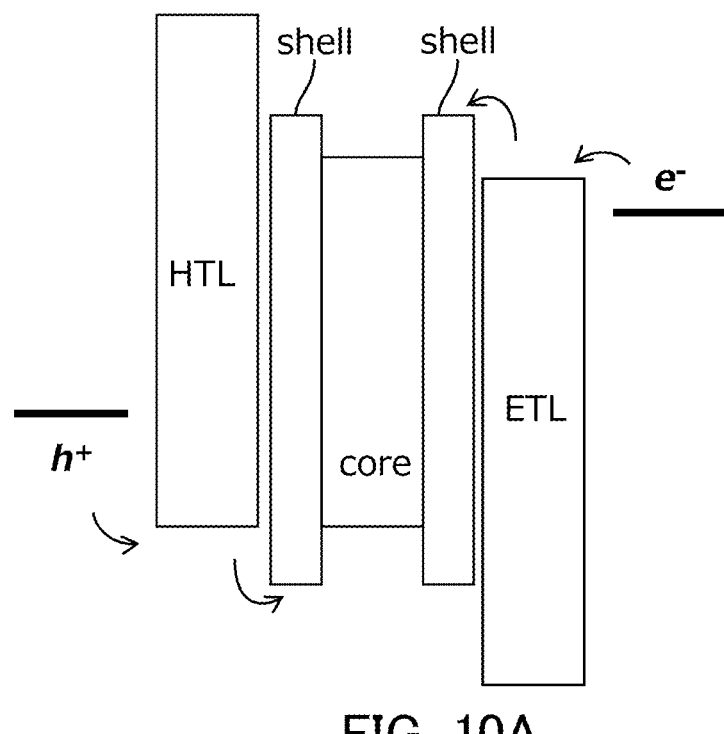
FIG. 10A is an energy level diagram in the case of using quantum dots having a core-shell structure.
Figure 10B:
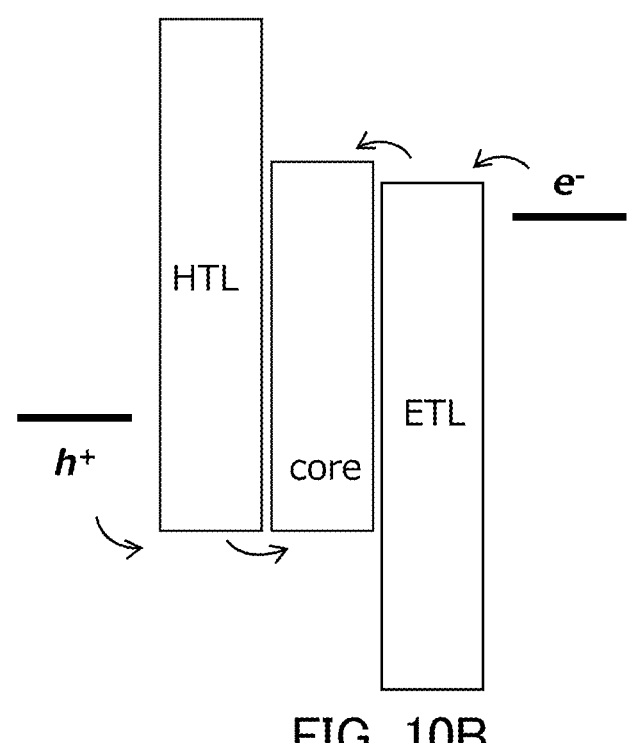
FIG. 10B is an energy level diagram in the case of using quantum dots having a structure in which a core is not covered by a shell.

When the quantum dots used in the emitting layer 13 of the embodiments in FIG. 8A to FIG. 9C have a core-shell structure, the energy level diagram presented in FIG. 10A is obtained, and the energy level of the shell would be as a barrier to the recombination of holes and electrons. Accordingly, using quantum dots in which the surface of the core is not covered with a shell as depicted in FIG. 10B eliminates the energy barrier to the recombination of hole and electrons, and allows holes and electrons to be efficiently recombined, thus the light emission efficiency can be improved. With a view to improving the electron transportation efficiency and the hole transportation efficiency, the organic ligands 21 are preferably placed on the surface of each quantum dot 20 as illustrated in FIG. 5A.

The light emitting devices of the embodiments shown in FIG. 8A to FIG. 9C are conventional EL devices, and the light emitting devices of the embodiments in FIGS. 4A and 4B and FIGS. 6A to 6C have layered structures opposite to that of the Conventional EL devices. In the light emitting devices of the embodiments shown in FIG. 8A to FIG. 9C, the thin film transistor is preferably a p-ch TFT; accordingly, the channel layer is preferably formed from a P-type semiconductor.

Figure 11:
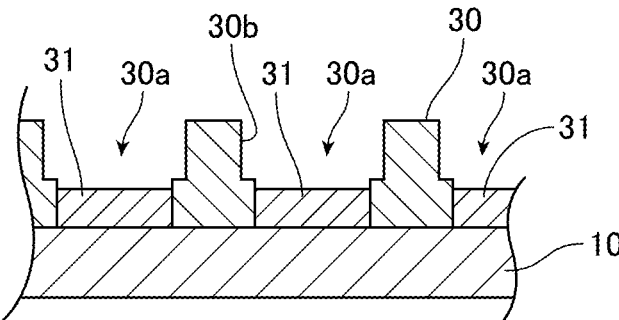
FIG. 11 is a schematic view illustrating a step of forming an inorganic layer by the inkjet process.

In this embodiment, at least one of the layer between the cathode 15 and the emitting layer 13, the emitting layer 13, and the layer between the emitting layer 13 and the anode 11 can be formed by the inkjet process. As illustrated in FIG. 11, a mask 30 is placed on the substrate 10, and an inorganic layer 31 is printed in a plurality of application regions 30a provided in the mask 30 by the inkjet process. Here, the surfaces of the sidewalls 30b of the rises of the mask 30 are, for example, subjected to fluorination to impart water repellency to the sidewalls 30b. This can reduce the affinity of the surface of the sidewalls 30b for ink and prevents defects such as dents in the surface of the printed inorganic layer 31, and thus can increase the flatness of the surface of the inorganic layer 31.

This embodiment involves top emission devices, and can improve the carrier balance in the inverted EL light emitting devices 3 depicted in FIGS. 4A and 4B and FIGS. 6A to 6C. In addition, the layers between the cathode 15 and the light emitting layer 13 (the electron transport layer 14 or both the electron transport layer 14 and the electron injection layer 18) and the light emitting layer 13 can be formed by coating. Further, the layers between the light emitting layer 13 and the anode 11 (the hole transport layer 12 or both the hole transport layer 12 and the hole injection layer 16) can be formed by vapor deposition or coating. This can facilitate the production process of the light emitting devices.

The display device 1 depicted in FIG. 1 is an example, and the arrangement of the red emission regions 2a, the green emission regions 2b, and the blue emission regions 2c may be different from that in FIG. 1. Further, of the red emission regions 2a, the green emission regions 2b, and the blue emission regions 2c, only the emission regions of one color or the emission regions of two colors may be included in the display device.

As in this embodiment, in a display device using quantum dots, the quantum dots can be used to build either a point light source or a surface light source, and a curved light source or a flexible product may also be obtained by selecting a suitable substrate.

Further, according to this embodiment, distinctive products such as lightings producing a mixture of colors comparable to that of sunlight which has been hardly obtained, lightings producing light easy on the eyes, and lightings optimized for plant factories can be developed.

Thus, display devices using quantum dots provide a high degree of flexibility in the design; for example, the devices can be formed to be thin, lightweight, and curved. Further, the devices can produce natural light not dazzling in the eyes that produces less shadows. In addition, the devices consume less power and have a long life. For example, display devices using quantum dots of this embodiment are superior to organic EL display devices in terms of color rendering properties, emission properties, product life, and product price.

A display device using quantum dots of this embodiment can be used as a PL emitter as well as an EL emitter. Further, for a display device using quantum dots, a hybrid light emitting device in which an EL emitter and a PL emitter are stacked can be obtained. For example, a PL emitter is superposed on a surface of an EL emitter, and the emission wavelength of the light emitted by excited quantum dots in the EL emitter can be changed using the quantum dots contained in the PL emitter. The EL emitter is a light emitting device having a layered structure described above, and the PL emitter is, for example, a sheet-like wavelength converting member in which a plurality of quantum dots are dispersed in a resin. Such a hybrid structure can be obtained with the use of quantum dots.

Note that in this embodiment, in order to both increase the area of the display device using quantum dots and reduce the production cost, the inkjet printing process, the spin coating process, or the dispensing process is preferably used as a method for applying the quantum dots.

EXAMPLES

The effects of the present invention will be described using Examples of the present invention. Note that the embodiments of the present invention are not limited to the following examples in any way.

The samples shown in Table 1 below were prepared to investigate the drop characteristics in the inkjet process. Note that in Table 1, "Abs10" refers to a sample exhibiting an absorbance of 10% with the quantum dots being dispersed, and "Abs20" refers to a sample exhibiting an absorbance of 20% with the quantum dots being dispersed.

be appropriately used; however, hydrophilic solvents are preferred. For example, as a hydrophilic solvent, an alcohol-based solvent can be used.

Figure 12:
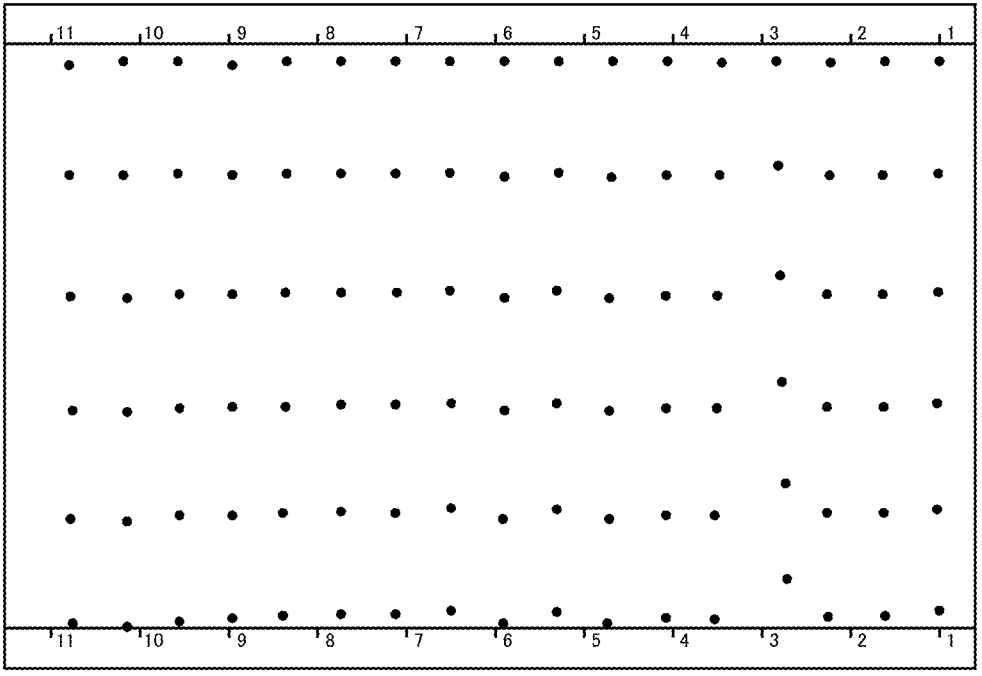
FIG. 12 is a photograph showing an application in Examples.

FIG. 12 is a photograph showing a state where the application was performed by the inkjet process using $ZnO_x$ dissolved in ethoxyethanol: EG=7:3 as a solvent. As shown in FIG. 12, a good application state was achieved.

TABLE 1

| Sample | Solvent | SG | Viscosity (mPa·s) | R.T. (° C.) | Ejection number | Mass (g) | Mass/ drop (g) | Volume/ drop (pL) | Drop | Adverse effect on EPDM | Notes |
|---|---|---|---|---|---|---|---|---|---|---|---|
| Green QD Abs10 | Cyclododecene | 0.87 | | 23.5 | 10 million | 0.0407 | 4.07E−09 | 4.68 | + | | |
| Red QD Abs20 | Cyclododecene | 0.87 | | 25.6 | 10 million | 0.0397 | 3.97E−09 | 4.56 | + | | |
| Red QD Abs20 | Tetradecane | 0.77 | | 26.1 | 10 million | 0.0303 | 3.03E−09 | 3.94 | + | Cap deformation | Head clogged |
| Green QD Abs10 | Tetradecane | | | | 10 million | Can-celled | | | + | | |
| Green QD Abs10 | Octadecene | 0.79 | 3.12 | 25.0 | 10 million | 0.0447 | 4.47E−09 | 5.66 | + | | |
| Red QD Abs20 | Octadecene | 0.79 | 2.97 | 26.7 | 10 million | 0.0449 | 4.49E−09 | 5.68 | + | | Previous head replacement |
| Polyvinyl-carbazole | Dimethoxybenzene | 1.08 | | 26.7 | 10 million | 0.0579 | 5.79E−09 | 5.34 | + | Head replacement twice | Clogging after ethanol cleaning/ Clogging of damper filter |
| Polyvinyl-carbazole | Dimethoxy-benzene:Cyclo-hexylbenzene 1:1 | | | | | | | | − | Mal-formation of drops (2 drops) | |
| Polyvinyl-carbazole | Dimethoxy-benzene:Cyclo-hexylbenzene 2:1 | 1.13 | | 26.5 | 10 million | 0.0527 | 5.27E−09 | 4.66 | + | | |
| Zinc oxide nanoparticles | IPA:Propylene glycol 1:1 | | | | | | | | − | Defective drops Possibly high viscosity | |
| Solvent only | Tetradecane | 0.77 | 1.60 | 23.8 | 1 million | 0.0040 | 4.00E−09 | 4.60 | + | | |
| | Tetradecane | | | | 3 million | 0.0126 | 4.20E−09 | 4.83 | + | | |
| | Tetradecane | | | | | 0.0109 | 3.63E−09 | 4.18 | + | | |
| | Tetradecane | | | | 10 million | 0.0362 | 3.62E−09 | 4.16 | + | | |
| Solvent only | ODE(1-Octadecene) | 0.79 | 3.10 | 23.0 | 10 million | 0.0385 | 3.85E−09 | 4.87 | + | Cap deformation | |
| Solvent only | Decahydro-naphthalene | 0.88 | 2.20 | 23.0 | 10 million | 0.0430 | 4.30E−09 | 4.89 | + | Affected | |
| Solvent only | Cyclododecene | 0.87 | 4.20 | 23.0 | 10 million | 0.0514 | 5.14E−09 | 5.91 | + | | |
| Solvent only | Ethylene glycol | 1.10 | 20.50 | 21.7 | Failed | — | — | — | − | Not affected | |
| Solvent only | Ethylene glycol 1:IPA 1 | 0.94 | 7.40 | 25.0 | 10 million | 0.0500 | 5.00E−09 | 5.32 | + | Not affected | IPA specific gravity: 0.78 |
| Solvent only | Ethylene glycol 3:IPA 1 | 1.02 | 12.80 | 22.7 | 10 million | 0.0481 | 4.81E−09 | 4.72 | + | Not affected | |
| Solvent only | Ethylene glycol 3:IPA 2 | 0.97 | 10.30 | 22.3 | 10 million | 0.0500 | 5.00E−09 | 5.15 | + | Not affected | |
| Solvent only | Phenylcyclohexane | 0.94 | 2.29 | 26.3 | 10 million | 0.0444 | 4.44E−09 | 4.72 | + | | |
| Solvent only | Dichlorobenzene | 1.30 | 1.62 | 25.5 | Failed | — | — | — | − | Affected | |
| Solvent only | n-Octane | 0.70 | Un-measur-able | 24.3 | Failed | — | — | — | − | Cap deformation | |

The "+" signs shown in the "drop" column in Table 1 correspond to the samples that had been appropriately dropped and the "−" signs correspond to the samples that were failed to be appropriately dropped.

In Table 1, the samples of "Red QD" and "Green QD" are used in emitting layers. Further, the samples of "polyvinyl-carbazole" are used in hole injection layers. The sample of "Zinc oxide nanoparticles" is used in an electron transport layer or an electron injection layer.

Table 1 shows that IPA and propylene glycol were not preferred as the solvent for zinc oxide nanoparticles, and another solvent had to be used. The solvents corresponding to the "+" signs in the "drop" column shown in Table 1 can Further, adverse effects on ethylene propylene diene monomer rubber (EPDM) inside an inkjet head was also investigated. As shown in Table 1, in some samples, cap deformation occurred or EPDM was adversely affected. This demonstrated that the effect on EPDM was preferably considered in the case of using EPDM.

(Experiment on Shell Thickness Dependence of Quantum Dot)

In this experiment, quantum dots (green QDs) of the samples shown in Table 2 were prepared. For a bottom emission display device including the light emitting device using the quantum dots in FIG. 4A, the relationship between the shell thickness and the external quantum efficiency (EQE) was investigated.

TABLE 2

| No. | Core | Coating 1 | Coating 2 | Coating 3 | Shell total (nm) | CV (%) | EQE (%) | QY (%) | FWHM | QD layer thickness |
|---|---|---|---|---|---|---|---|---|---|---|
| 1 | GC_A | I_A | II_A | III_A Thick 1 | 1.8 | 17.2 | — | 86 | 38 | — |
| 2 | GC_A | I_A | II_A | III_A Thick 2 | 2.4 | 18.8 | 4.5 | 80 | 39 | 37 |
| 3 | GC_A | I_A | II_A | III_A Thick 3 | 3.1 | 15.2 | 0.9 | 43 | 39 | 23 |
| 4 | GC_A | I_A | II_A | — | 1.2 | 12.4 | 0.5 | 85 | 30 | 15 |
| 5 | GC_A | I_A | II_B | — | 1.8 | 21.9 | 2 | 88 | 32 | 25 |
| 6 | GC_A | I_A | II_C | — | 2 | 18.9 | 1.2 | 82 | 38 | 27 |
| 7 | GC_A | — | — | — | Reference | 10.3 | — | 13 | 30 |  |
| 8 | GC_A | I_B Thin | — | — | 0.2 | 16.8 |  | 10 | 38 |  |
| 9 | GC_A | I_B Thin | — | — | 0.9 | 12.5 |  | 91 | 34 |  |
| 10 | GC_A | I_B | — | — | 1.3 | 12.9 | 6 | 86 | 33 | 36 |
| 11 | GC_A | I_B | II_D | — | 1.4 | 14.5 | 6 | 93 | 33 | 31 |

As shown in Table 2, a correlation was found between the shell thickness and the EQE. The shell thickness was, but not limited to, 0.1 nm or more and 4.0 nm or less, preferably 0.5 nm or more and 3.5 nm or less, more preferably 1.0 nm or more and 3.0 nm or less, still more preferably 1.3 nm or more and 2.5 nm or less.

Further, the relationship between the quantum dot (QD) layer thickness and the EQE was investigated, and the EQE was found to tend to be higher when the QD layer had a certain level of thickness. The QD layer thickness was, but not limited to, 5 nm or more and 50 nm or less, preferably 10 nm or more and 45 nm or less, more preferably 15 nm or more and 40 nm or less, still more preferably 20 nm or more and 40 nm or less, yet more preferably 25 nm or more and 40 nm or less.

Figure 13:
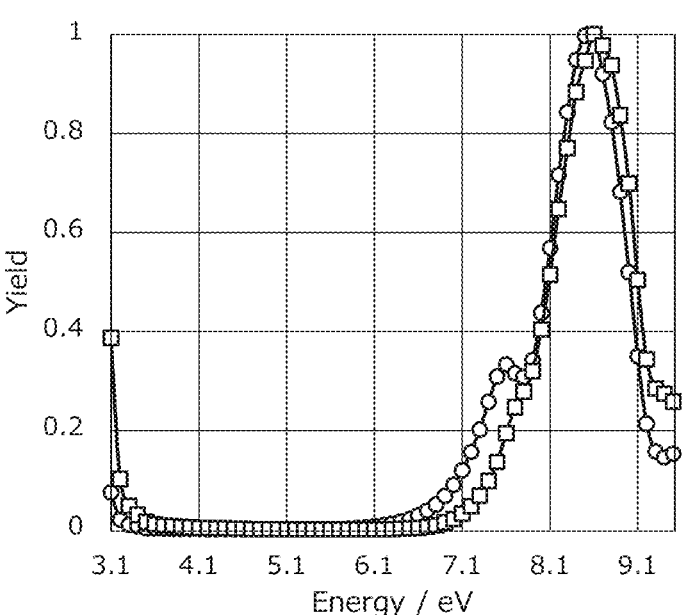
FIG. 13 shows PYS measurement data of Cd-based green quantum dots.

Further, Cd-based green quantum dots were subjected to PYS measurements. In FIG. 13, the circle marks represent experimental data of the quantum dots each constituted by a core alone in Example 1, and the square marks represent experimental data of the quantum dots constituted by a core coated with a shell in Example 2.

The photo-electron yield spectroscopy (PYS) can measure the ionization potential. For example, the measurement can be performed using a system named AC-2/AC-3 manufactured by RIKEN KEIKI CO., LTD.

As shown in FIG. 13, the energy of the rising edge in Example 1 was found to be different from that in Example 2. The energy rose at approximately 6.1 eV in Example 1, and the energy rose at approximately 7.1 eV in Example 2.

Figure 14:
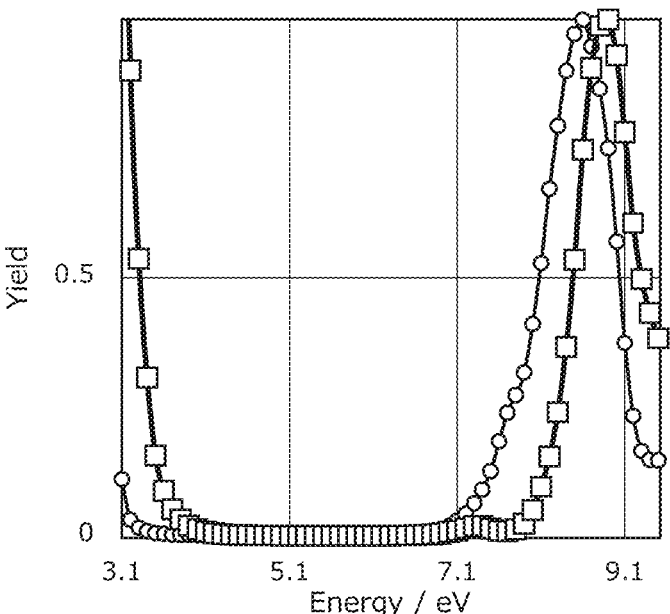
FIG. 14 shows PYS measurement data.

FIG. 14 shows the PYS measurement results of the Cd-based green quantum dots with different shell thicknesses in Example 3 and Example 4. The shell thickness was larger in Example 4 than in Example 3. The energy of the rising edge in Example 3 was found to be different from that in Example 4. The energy rose at approximately 7.1 eV in Example 3, and the energy rose at approximately 8.1 eV in Example 4.

(Experiment on Current Dependence of EQE)

FIG. 15 is an energy level diagram of each layer in the light emitting device used in an experiment. FIG. 16 is a graph illustrating the relationship between the current value and the EQE of an EL emitter and a PL emitter using red quantum dots; Further, FIG. 17 shows plots illustrating the relationship between the current value and the EQE of an EL emitter and a PL emitter using red quantum dots; and a plot illustrating the relationship between the current value and the EQE of an EL emitter using blue quantum dots. The shell thicknesses in Example 5 and Example 6 in FIG. 16 were different. The shell thickness was larger in Example 5 than different.

in Example 6. Further, in FIG. 17, the shell thickness was largest in Example 7, and the shell thickness was smaller in Example 8 and Example 9 in this order.

As shown in FIG. 16 and FIG. 17, for the EL emitter and the PL emitter, the EQE increased to the point around 20 mA. On the other hand, in the red emission device, the EQE increased even when the current value was 20 mA or more. As shown in FIG. 16 and FIG. 17, a larger shell thickness resulted in a larger increase in the EQE.

(Experiment on $ZnO_x$ Synthesis)

Figure 18:
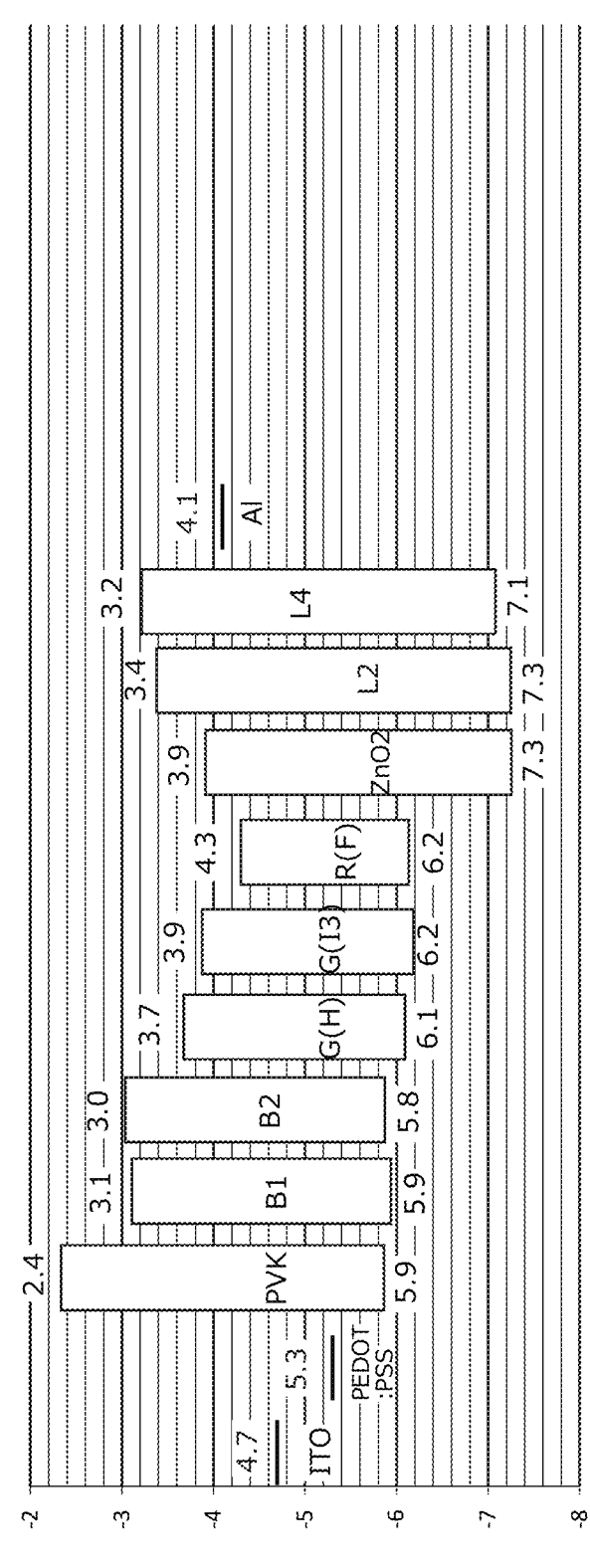
FIG. 18 presents a graph illustrating the energy band gap Eg of each layer in the light emitting device used in an experiment, the energy ECB at the bottom of the conduction band, and the energy ECB at the top of the conduction band, and an energy level diagram of the layers.

FIG. 18 presents a graph illustrating the energy band gap Eg of each layer in the light emitting device used in an experiment, the energy ECB at the bottom of the conduction band, and the energy ECB at the top of the conduction band, and an energy level diagram of the layers. $ZnO_x$(Li) was used as L1 or L2 in FIG. 18. Here, Li may or may not be added. X is, but not limited to, around 0.8 to 1.2. As shown in FIG. 18, it was found that use of $ZnO_x$ (Li) as $ZnO_x$ used for the electron injection layer (ETL) and the electron transport layer increased the band gap. $ZnO_x$ (Li) is presumed to have an effect of reducing the particle diameter. PVK shown in FIG. 18 corresponds to a hole injection layer; B1, B2, G (H), G (13), and R(F) correspond to emitting layers (EL layers); and $ZnO_x$, L2, and L4 correspond to electron injection layers. When B1 or B2 is used for the emitting layer, $ZnO_x$ can be used for the electron injection layer; however, it was found that when G (H), G (13), or R(F) was used for the emitting layer, L2 or L4 was preferably used for the electron injection layer. L2 and L4 are $ZnO_x$ (Li).

In particular, when an emitting layer (EL layer) with a shallow conduction band is used, it is advantageous to use $ZnO_x$ (Li) for the electron injection layer or the electron transport layer.

$ZnO_x$ (Li) can be, but not exclusively, prepared by stirring a zinc acetate-ethanol solution at a predetermined temperature for a predetermined time, and then mixing and stirring a LiOH·4H₂O-ethanol solution, followed by centrifugal separation, cleaning, etc.

Figure 19:
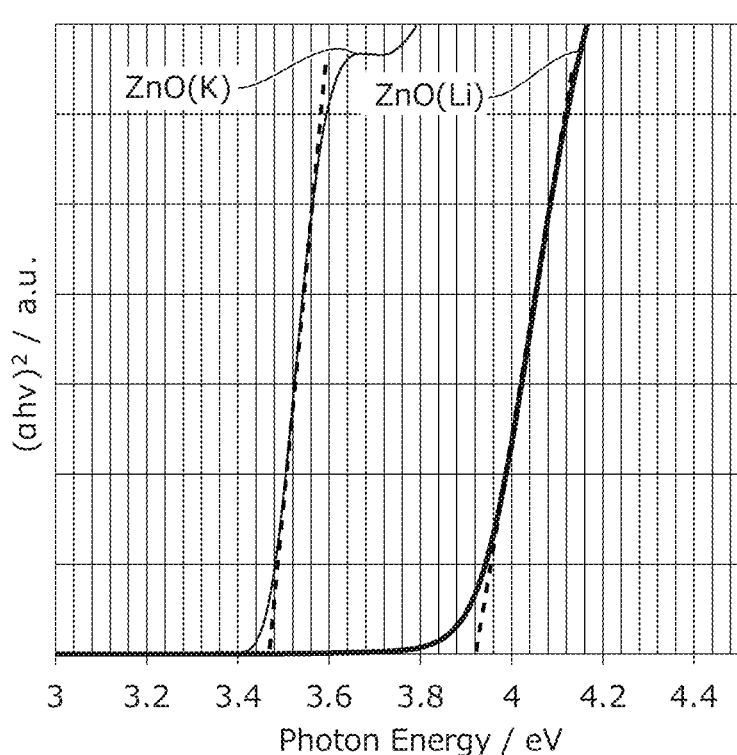
FIG. 19 shows the UV data of $ZnO_x(Li)$ and $ZnO_x(K)$ used in an electron transport layer (ETL)
Figure 20:
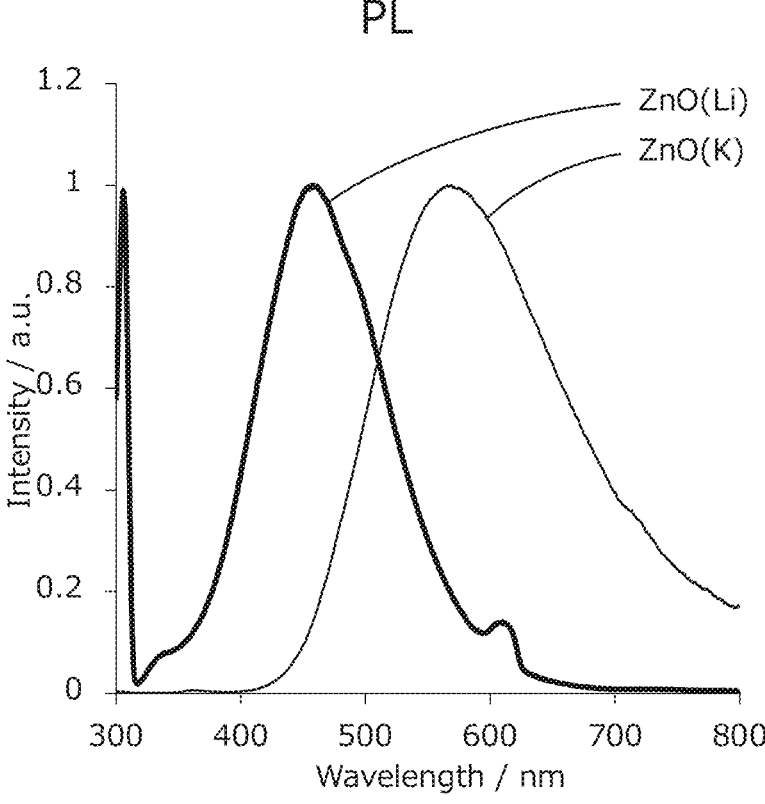
FIG. 20 shows the PL data of $ZnO_x(Li)$ and $ZnO_x(K)$ used in an electron transport layer (ETL)
Figure 21:
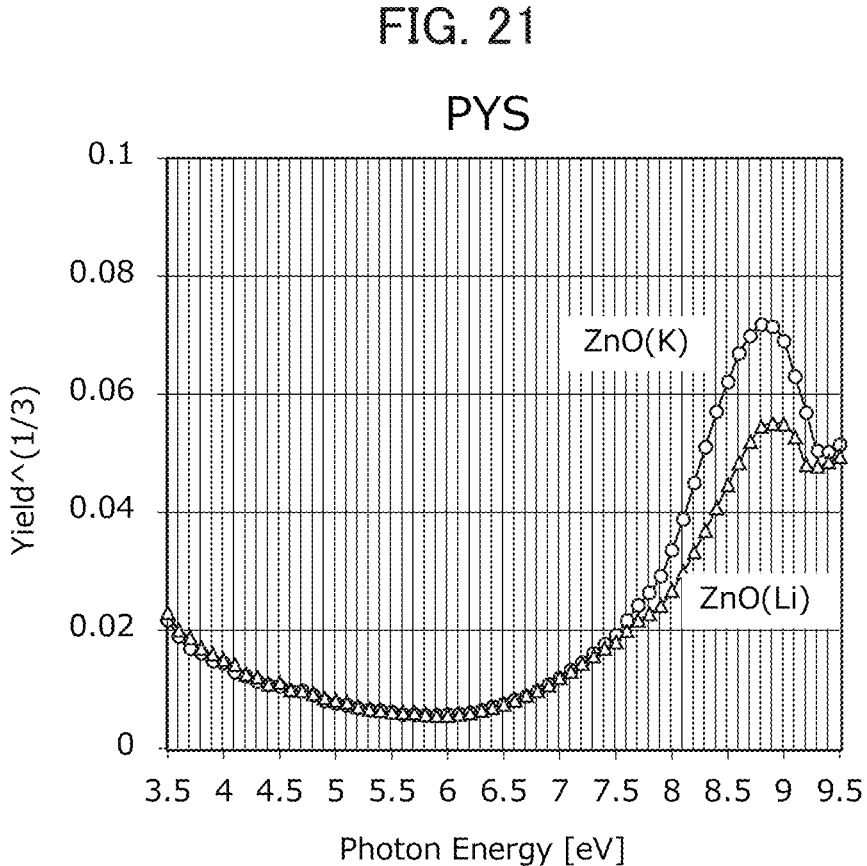
FIG. 21 shows the PYS data of $ZnO_x(Li)$ and $ZnO_x(K)$ used in an electron transport layer (ETL).

FIG. 19 to FIG. 21 show the UV (band gap), the PL spectra, and the PYS data of $ZnO_x$(Li) and $ZnO_x$(K) used for the electron injection layer (ETL). $ZnO_x$(K) was produced using KOH catalytically and was not doped with K or Li. $ZnO_x$(Li) and $ZnO_x$(K) were found to show differences in the UV data and the PL data. On the other hand, the PYS data of $ZnO_x$(Li) and $ZnO_x$(K) hardly differed, and the rising edge energies were almost the same.

Thus, $ZnO_x$ of which band gap is controlled by selecting from different particle diameters to be used for an electron injection/transport layer of an EL device using quantum dots, and doped $ZnO_x$ for which defects are controlled and the band gap is controlled by adding doping species can be proposed.

When the recombination of electrons and holes for producing light cannot still be brought into balance, hole blocking functions are preferably added by interposing a thick insulating layer between the EL layer and the electron injection layer or integrating $ZnO_x$ with molecules thereby adjusting the balance. Here, the integrated layer involves the integration of, for example, $ZnO_x$ with T2T (2,4,6-tris(bi-phenyl-3-yl)-1,3,5-triazine). X is, but not limited to, around 0.8 to 1.2.

Further, $ZnO_x$ is known to have functions suitable for use in not only the electron injection/transport layer but also in a hole injection/transportation layer by performing ozone treatment or the like. Specifically, performing ozone treatment on $ZnO_x$ was found to improve the hole transporting performance.

INDUSTRIAL APPLICABILITY

According to the present invention, a light emitting device containing quantum dots can be used for a display device, and excellent emission properties can be obtained.

This application is based on Japanese patent application No. 2017-215801 filed on Nov. 8, 2017, the content of which is hereby incorporated in its entirety.

What is claimed is:

1. A display device, comprising:
a display area,
wherein the display area includes a light emitting device in which a first electrode, a first layer between the first electrode and an emitting layer, the emitting layer, a second layer between the emitting layer and a second electrode, and the second electrode are stacked in this order on a substrate,
the emitting layer is formed of an inorganic layer containing quantum dots, and the light emitting device is a top emission device,
a thin film transistor is connected to the light emitting device, and the thin film transistor is an n-ch TFT,
an oxide semiconductor of the thin film transistor is an In—Ga—Zn—O-based semiconductor,
a film thickness of the inorganic layer containing the quantum dots is in a range from 25 nm to 37 nm,
one of the first electrode and the second electrode is an anode and an other of the first electrode and the second electrode is a cathode, and
a layer between the anode and the emitting layer comprises a layer formed of nanoparticles of NiO.

2. The display device according to claim 1, wherein
the display device comprises a structure in which the light emitting device and the thin film transistor are interposed between a pair of substrates, and
a sealing resin is provided between the pair of substrates so that the pair of substrates are connected to each other via the sealing resin.

3. The display device according to claim 1, wherein the display device is flexible.

4. The display device according to claim 1, wherein the quantum dots include a structure in which a surface of a core is not covered by a shell.

5. The display device according to claim 1, wherein at least one of the first layer between the first electrode and the emitting layer, the emitting layer, and the second layer between the emitting layer and the second electrode is formed by an inkjet process.

6. The display device according to claim 1, wherein the first layer between the first electrode and the emitting layer, and the emitting layer are formed by coating; and the second layer between the emitting layer and the second electrode is formed by vapor deposition or coating.

7. The display device according to claim 1, wherein the quantum dots have a core-shell structure with a shell thickness from 1.2 nm to 3.1 nm.

8. The display device according to claim 1, wherein the emitting layer is a quantum dot layer formed by coating quantum dots.

9. The display device according to claim 1, wherein a layer between the cathode and the emitting layer includes a layer formed of $ZnO_x(Li)$, wherein x is in a range of 0.8 to 1.2.

10. The display device according to claim 1, wherein the quantum dots do not contain Cd and are formed of ZnS, ZnSe, ZnSeS, ZnTe, ZnTeS, InP, $(Zn)AgInS_2$, or $(Zn)CuInS_2$.

11. The display device according to claim 1, wherein the display device is adjusted to not emit light having a wavelength shorter than 450 nm.

12. The display device according to claim 1, wherein the emitting layer, the layer between the anode and the emitting layer, and a layer between the cathode and the emitting layer are each formed of an inorganic layer containing nanoparticles.

13. The display device according to claim 1, wherein the display device comprises a lighting display device having color mixing properties equivalent to sunlight, or a lighting display device suitable for a plant cultivation factory.

* * * * *